US010726686B2

(12) United States Patent
Grancharov et al.

(10) Patent No.: US 10,726,686 B2
(45) Date of Patent: Jul. 28, 2020

(54) ENCODING AND DECODING MULTICHANNEL HAPTIC DATA BY DETERMINING AN ORDER OF A PLURALITY OF CHANNELS

(71) Applicant: Telefonaktiebolaget LM Ericsson (publ), Stockholm (SE)

(72) Inventors: Volodya Grancharov, Solna (SE); Lars Andersson, Solna (SE); José Araújo, Stockholm (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/334,185

(22) PCT Filed: Sep. 19, 2016

(86) PCT No.: PCT/EP2016/072137
§ 371 (c)(1),
(2) Date: Mar. 18, 2019

(87) PCT Pub. No.: WO2018/050249
PCT Pub. Date: Mar. 22, 2018

(65) Prior Publication Data
US 2019/0206204 A1 Jul. 4, 2019

(51) Int. Cl.
*G08B 6/00* (2006.01)
*G06F 3/01* (2006.01)
*H03M 7/30* (2006.01)

(52) U.S. Cl.
CPC ............... *G08B 6/00* (2013.01); *G06F 3/01* (2013.01); *G06F 3/016* (2013.01); *H03M 7/70* (2013.01); *G06F 3/014* (2013.01)

(58) Field of Classification Search
CPC ... G08B 6/00; G06F 3/01; G06F 3/014; G06F 3/016; H03M 7/70; H03M 13/1148;
(Continued)

(56) References Cited

U.S. PATENT DOCUMENTS

| | | | | |
|---|---|---|---|---|
| 5,717,394 A | * | 2/1998 | Schwartz | ............ H03M 7/4006 341/107 |
| 2003/0058216 A1 | | 3/2003 | Lacroix et al. | |

(Continued)

FOREIGN PATENT DOCUMENTS

WO  95/20788 A1  8/1995

OTHER PUBLICATIONS

International Search Report and Written Opinion issued in International Application No. PCT/EP2016/07237, dated May 24, 2017, 10 pages.
(Continued)

*Primary Examiner* — Orlando Bousono
(74) *Attorney, Agent, or Firm* — Sage Patent Group

(57) ABSTRACT

It is presented a method for encoding haptic data for a plurality of channels. The method comprises the steps of: determining an order of the plurality of channels in a first list based on a respective previous codeword data item for each of the plurality of channels, each previous codeword data item being either a no-change data item, or a change data item, wherein the order is such that all no-change previous codeword data items are arranged at one end of the first list; arranging current codewords in a second list accordance with the channel order of the first list; grouping the current codewords in consecutive groups; generating a group index indicating whether each group contains only no-change codewords or at least one change codeword; and outputting the group index along with current codewords, wherein current codewords are only output for groups containing at least one change codeword.

20 Claims, 5 Drawing Sheets

(58) Field of Classification Search
CPC ......... H03M 13/2903; H03M 13/2906; H03M 13/2948; H03M 13/451
See application file for complete search history.

(56) References Cited

U.S. PATENT DOCUMENTS

2009/0122006 A1    5/2009  Nielsen
2012/0300873 A1*  11/2012  Graumann ......... H03M 13/1148
                                              375/295

OTHER PUBLICATIONS

Chaudhariu, R. et al., "Perceptual and Bitrate-Scalable Coding of Haptic Surface Texture Signals", IEEE Journal of Selected Topics in Signal Processing, vol. 9, No. 3, Apr. 2015, pp. 462-473.

* cited by examiner

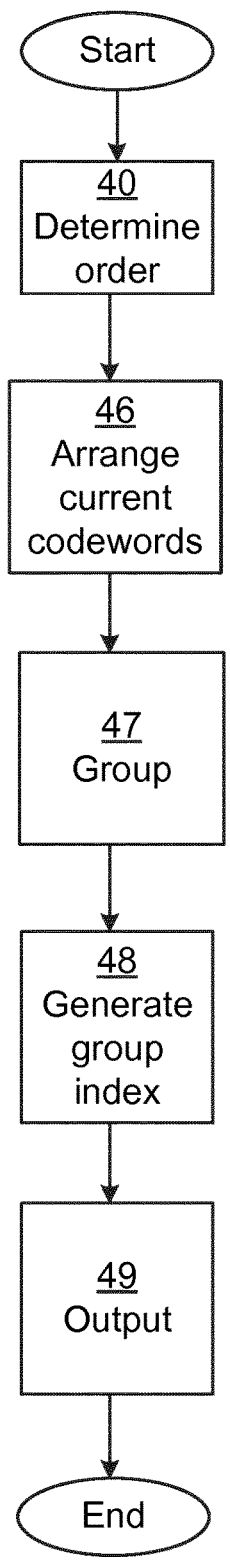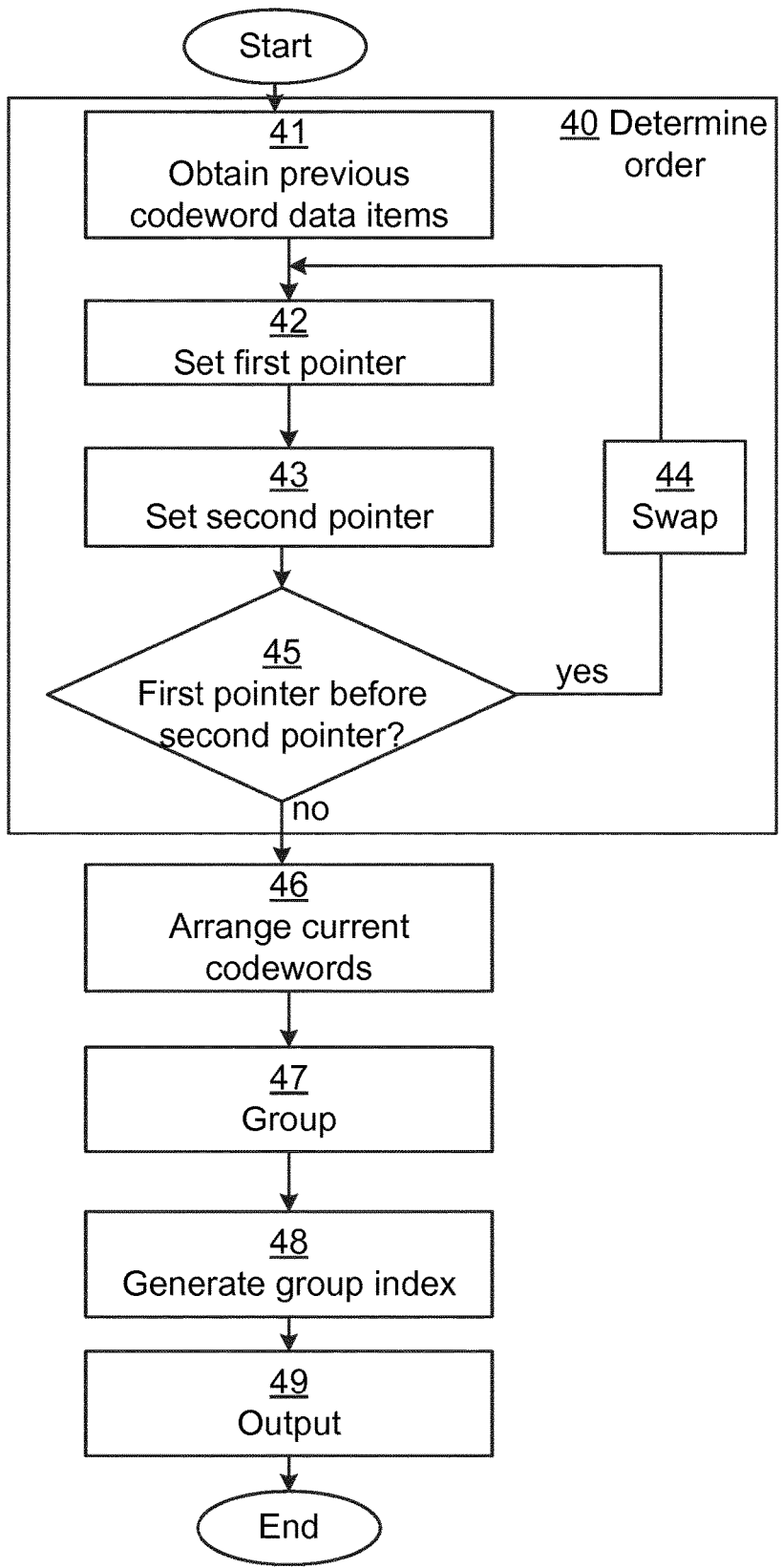
Fig. 3A
Fig. 3B

ENCODING AND DECODING MULTICHANNEL HAPTIC DATA BY DETERMINING AN ORDER OF A PLURALITY OF CHANNELS

CROSS REFERENCE TO RELATED APPLICATION(S)

This application is a 35 U.S.C. § 371 National Stage of International Patent Application No. PCT/EP2016/072137, filed Sep. 19, 2016, designating the United States.

TECHNICAL FIELD

The invention relates to methods, encoders, decoders, computer programs, and computer program products relating to encoding and decoding haptic data for a plurality of channels.

BACKGROUND

Haptic internet is seen as the next step on mobile networking. Users are currently able to efficiently communicate over voice and video, but in the future networked society, it is envisioned that people will be able to communicate the sense of touch via haptic devices. There has been a large amount of research on devices, which allow such communication to take place. Several haptic interfaces are now appearing in the market, which deliver haptic feedback using different actuation technologies such as ultrasound, vibrotactile, electrostatic and piezoelectric.

Haptic perception consists of both kinesthetic and tactile sense and relates to the sensation of the size, shape, mass, texture and stiffness of physical objects, surfaces, etc. Kinesthetic information refers to the information perceived when moving joints, muscles and tendons, while tactile information refers to information retrieved via the skin. In a haptic system, the amount of data representing all the sensors quickly becomes large. Hence, data compression is needed to keep the data transfer requirements at a reasonable level. However, the data compression and decompression can introduce delays. Since any delay can seriously reduce the experience of the user, any compression and decompression which is used should be designed such that the amount of delay which is introduced is as small as possible.

R. Chaudhariu, C. Schuwerk, M. Danaei, and E. Steinbach, "Perceptual and Bitrate-scalable Coding of Haptic Surface Texture Signals," *IEEE J. Selected Topics in Signal Processing*, vol. 9, no. 3, pp. 462-473, 2015, discloses a bitrate scalable haptic texture codec, which incorporates a masking model based on weaker signals close in frequency to a powerful signal being masked.

SUMMARY

It is an object to further reduce bitrate requirements for haptic data.

According to a first aspect, it is presented a method for encoding haptic data for a plurality of channels. The method is performed by an encoder and comprises the steps of: determining an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; arranging current codewords in a second list accordance with the channel order of the first list; grouping the current codewords in consecutive groups based on the order of the current codewords in the second list; wherein each group contains a plurality of current codewords; generating a group index indicating whether each group contains only no-change codewords or at least one change codeword; and outputting the group index along with current codewords, wherein current codewords are only output for groups containing at least one change codeword.

The step of determining an order may comprise the sub-steps of: obtaining a respective previous codeword data item for each of the plurality of channels, the previous codeword data item being ordered by channels in a first list, each previous codeword data item being based on at least one previous codeword for the respective channel; setting a first pointer on the first previous codeword data item, in the first list, which is a no-change data item; setting a second pointer on the last previous codeword data item, in the first list, which is a change data item; swapping the previous codeword data item pointed to by the first pointer and the previous codeword data item pointed to by the second pointer, when the first pointer is before the second pointer in the first list, wherein each previous codeword data item keeps a channel reference during the swapping; and repeating the steps of setting a first pointer, setting a second pointer and swapping until the first pointer is after the second pointer in the first list.

The no-change codeword may consist of one or more zeros.

The group index may comprise an indicator for each group, each indicator indicating whether the respective group contains only no-change data items or at least one change data item.

Each previous codeword data item may be the most recent previous codeword for the channel in question.

Each previous codeword data item may be derived based on a plurality of previous codewords for the channel in question.

According to a second aspect, it is presented an encoder for encoding haptic data for a plurality of channels. The encoder comprises: a processor storing instructions that, when executed by the processor, causes the encoder to: determine an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; arrange current codewords in a second list accordance with the channel order of the first list; group the current codewords in consecutive groups based on the order of the current codewords in the second list; wherein each group contains a plurality of current codewords; generate a group index indicating whether each group contains only no-change codewords or at least one change codeword; and output the group index along with current codewords, wherein current codewords are only output for groups containing at least one change codeword. encoder The instructions to determine an order may comprise instructions to: obtain a respective previous codeword data item for each of the plurality of channels, the previous codeword data item being ordered by channels in a first list, each previous codeword data item being based on at least one previous codeword for the respective channel; set a first pointer on the first previous codeword data item, in the first list, which is a no-change data item; set a second pointer on the last previous codeword data item, in the first list, which is a change data item; swap the previous codeword data item pointed to by the first pointer and the previous codeword data item pointed to by the second pointer, when the first pointer is before the second pointer in the first list, wherein each previous codeword data item keeps a channel reference during the swapping; and repeat the instructions to set a first pointer, set a second pointer and swap until the first pointer is after the second pointer in the first list.

The no-change codeword may consist of one or more zeros.

The group index may comprise an indicator for each group, each indicator indicating whether the respective group contains only no-change data items or at least one change data item.

Each previous codeword data item may be the most recent previous codeword for the channel in question.

Each previous codeword data item may be derived based on a plurality of previous codewords for the channel in question.

According to a third aspect, it is presented an encoder comprising: means for determining an order of a plurality of channels providing haptic data in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; means for arranging current codewords in a second list accordance with the channel order of the first list; means for grouping the current codewords in consecutive groups based on the order of the current codewords in the second list; wherein each group contains a plurality of current codewords; means for generating a group index indicating whether each group contains only no-change codewords or at least one change codeword; and means for outputting the group index along with current codewords, wherein current codewords are only output for groups containing at least one change codeword.

According to a fourth aspect, it is presented a computer program for encoding haptic data for a plurality of channels. The computer program comprises computer program code which, when run on an encoder causes the encoder to: obtain a respective previous codeword data item for each of the plurality of channels, the previous codeword data item being ordered by channels in a first list, each previous codeword data item being based on at least one previous codeword for the respective channel, the previous codeword data item being either a no-change data item indicating no change of channel data, or a change data item indicating a change of channel data; set a first pointer on the first previous codeword data item, in the first list, which is a no-change data item; set a second pointer on the last previous codeword data item, in the first list, which is a change data item; swap the previous codeword data item pointed to by the first pointer and the previous codeword data item pointed to by the second pointer, when the first pointer is before the second pointer in the first list, wherein each previous codeword data item keeps a channel reference during the swapping; and repeat the instructions to set a first pointer, set a second pointer and swap until the first pointer is after the second pointer in the first list.

According to a fifth aspect, it is presented a computer program product comprising a computer program according to the fourth aspect and a computer readable means on which the computer program is stored.

According to a sixth aspect, it is presented a method for decoding haptic data for a plurality of channels. The method is performed by a decoder and comprises the steps of: determining an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; receiving a group index and current codewords for groups of channels of the plurality of channels; generating no-change codewords for channels in any group of channels indicated by the group index to contain only no-change codewords; combining the generated codewords with the received codewords, yielding current codewords; arranging the current codewords in a second list accordance with the channel order of the first list; reordering the second list by channels; and outputting the reordered second list.

The step of determining an order may comprise the sub-steps of: obtaining a respective previous codeword data item for each of the plurality of channels, the previous codeword data items being ordered by channels in a first list, each previous codeword data item being based on at least one previous codeword for the respective channel; setting a first pointer on the first previous codeword data item, in the first list, which is a no-change data item; setting a second pointer on the last previous codeword data item, in the first list, which is a change data item; swapping the previous codeword data item pointed to by the first pointer and the previous codeword data item pointed to by the second pointer, when the first pointer is before the second pointer in the first list, wherein each previous codeword data item keeps a channel reference during the swapping; and repeating the steps of setting a first pointer, setting a second pointer and swapping until the first pointer is after the second pointer in the first list.

The no-change codeword may consist of one or more zeros.

The group index may comprise an indicator for each group, each indicator indicating whether the respective group contains only no-change data items or at least one change data item.

Each previous codeword data item may be the most recent previous codeword for the channel in question.

Each previous codeword data item may be derived based on a plurality of previous codewords for the channel in question.

According to a seventh aspect, it is presented a decoder for decoding haptic data for a plurality of channels. The decoder comprises: a processor storing instructions that, when executed by the processor, causes the decoder to: determine an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; receive a group index and current codewords for groups of channels of the plurality of channels; generate no-change codewords for channels in any group of channels indicated by the group index to contain only no-change codewords; combine the generated codewords with the received codewords, yielding current codewords; arrange the current codewords in a second list accordance with the channel order of the first list; reorder the second list by channels; and output the reordered second list.

The instructions to determine an order may comprise instructions to: obtain a respective previous codeword data item for each of the plurality of channels, the previous codeword data items being ordered by channels in a first list, each previous codeword data item being based on at least one previous codeword for the respective channel; set a first pointer on the first previous codeword data item, in the first list, which is a no-change data item; set a second pointer on the last previous codeword data item, in the first list, which is a change data item; swap the previous codeword data item pointed to by the first pointer and the previous codeword data item pointed to by the second pointer, when the first pointer is before the second pointer in the first list, wherein each previous codeword data item keeps a channel reference during the swapping; and repeat the instructions to set a first pointer, set a second pointer and swap until the first pointer is after the second pointer in the first list.

The no-change codeword may consist of one or more zeros.

The group index may comprise an indicator for each group, each indicator indicating whether the respective group contains only no-change data items or at least one change data item.

Each previous codeword data item may be the most recent previous codeword for the channel in question.

Each previous codeword data item may be derived based on a plurality of previous codewords for the channel in question.

According to an eighth aspect, it is presented a decoder comprising: means for determining an order of a plurality of channels, for providing haptic data, in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; means for receiving a group index and current codewords for groups of channels of the plurality of channels; means for generating no-change codewords for channels in any group of channels indicated by the group index to contain only no-change codewords; means for combining the generated codewords with the received codewords, yielding current codewords; means for arranging the current codewords in a second list accordance with the channel order of the first list; means for reordering the second list by channels; and means for outputting the reordered second list.

According to a ninth aspect, it is presented a computer program for decoding haptic data for a plurality of channels, the computer program comprising computer program code which, when run on a decoder causes the decoder to: determine an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list; receive a group index and current codewords for groups of channels of the plurality of channels; generate no-change codewords for channels in any group of channels indicated by the group index to contain only no-change codewords; combine the generated codewords with the received codewords, yielding current codewords; arrange the current codewords in a second list accordance with the channel order of the first list; reorder the second list by channels; and output the reordered second list.

According to a tenth aspect, it is presented a computer program product comprising a computer program according to the ninth aspect and a computer readable means on which the computer program is stored.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIGS. 3A-B are flow charts illustrating embodiments of methods for encoding haptic data for a plurality of channels performed in an encoder;

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
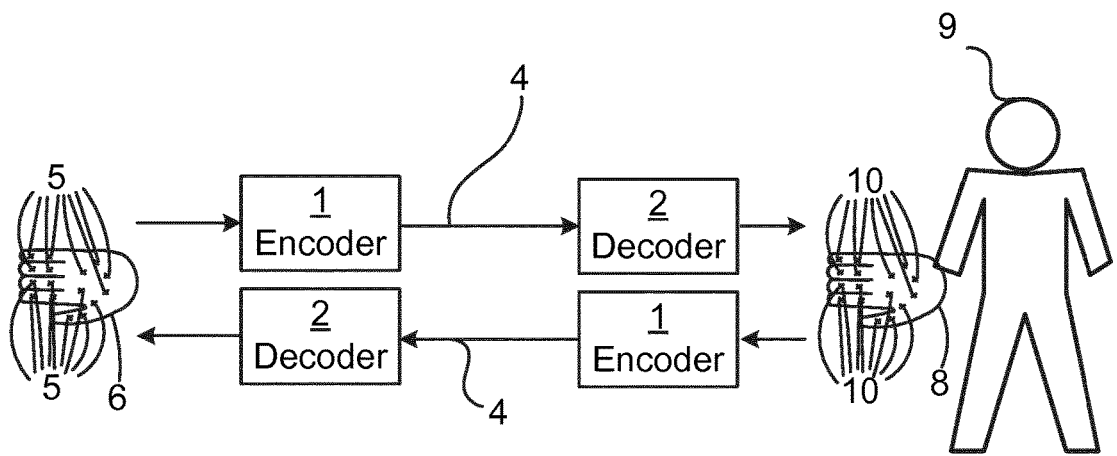
FIG. 1 is a schematic diagram illustrating an environment in which embodiments presented herein can be applied.

FIG. 1 is a schematic diagram illustrating an environment in which embodiments presented herein can be applied. A user 9 is here connected to interact with a remote device 6. The remote device 6 comprises a number of sensors 5. Although not shown, the remote device 6 also comprises one or more actuators which can be controlled by the user 9. The sensors 5 generate data which is input to an encoder 1. Since there are multiple sensors 5, the data input to the encoder 1 is multichannel data, where each channel is associated with a separate set of one or more sensors.

The encoder 1 compresses the multichannel data to encoded data 4 and outputs the data for transmission to a decoder 2. The transmission can occur using any communication technology known in the art per se, e.g. over a Local Area Network (LAN), such as Ethernet and/or using a Wide Area Network (WAN), e.g. using Internet Protocol (IP). In any case, the encoded data 4 is received by the decoder 2, which decompresses the encoded data 4 to signals which are suitable for provision to actuators 10 of a user device 8. It is to be noted that the term 'remote' in this context does not need to be far away. 'Remote' only implies that there is communication between the user device 8 and the remote device 6.

Hence, the actuators 10 of the user device 8 provide haptic sensations reflecting what is detected by the sensors 5. This allows a user 9 of the user device 8 to haptically experience a physical environment which can be located remotely, which can be in another room or in another country from the user 9.

Optionally, the equivalent communication occurs in the other direction from the master (the user device 8) to the slave (the remote device 6). In other words, there is may also be an encoder 1 by the user device 8 and a decoder 2 by the remote device 6, to thereby communicate haptic data from sensors (not shown) in the user device 8 to control actuators (not shown) in the remote device 6.

While the user device 8 is here shown as a glove where the user can insert a hand in the user device 8, the user device 8 can be provided in any suitable way that allows haptic perception for the user 9. For instance, the user device 8 could be an exoskeleton, etc. In any case, the remote device 6 provides sensors in a way that makes sense in terms of the physical appearance of the user device 8.

To illustrate the requirements for such a multichannel system, one can consider a teleoperation scenario where an operator uses an exoskeleton (master device), which is capable of providing both tactile and kinesthetic feedback to his/her hands and his/her forearm and upper arms, to control a slave device (e.g. a robot).

In order to perform the teleoperation, the measured values (e.g. position, acceleration, and/force force) at the master are communicated to the control unit at the slave side, while the measured values at the slave side are communicated to the control unit at the master side. With such a setup, the operator is able to perform the precise control of the robotic arms, while he/she is also provided with tactile feedback.

This setup possesses three data channels (position, acceleration and force) per sensor measurement per location. As a possible implementation, one may consider that there exists one acquisition point for each finger, one for the wrist, and one for the forearm and one for the upper arm, resulting in a total of 13 acquisition points.

This would result in a total number of sensors of 39 (13*3 data channels (position, acceleration and force)), where each sensor has three dimensions, resulting in 117 (13*3*3) data channels. If each data channel requires 32 Kbps (kilobits per second), the total bandwidth needed can be calculated as 32 Kbps*117=3.744 Mbps. Hence, it is evident that an efficient compression system is of great benefit to enable this type of haptic application with a reasonable data rate requirement.

Teleoperation systems with haptic feedback may become unstable if the closed-loop system experiences latency larger than tens of milliseconds. Additionally, research has shown than for latency above to ms, the teleoperation transparency is greatly reduced, affecting both the perception quality as well as the task performance. Hence, the compression system should not introduce further algorithmic delay. This implies that block processing is not allowed, preventing conventional multichannel compression schemes from being applied.

Figure 2:
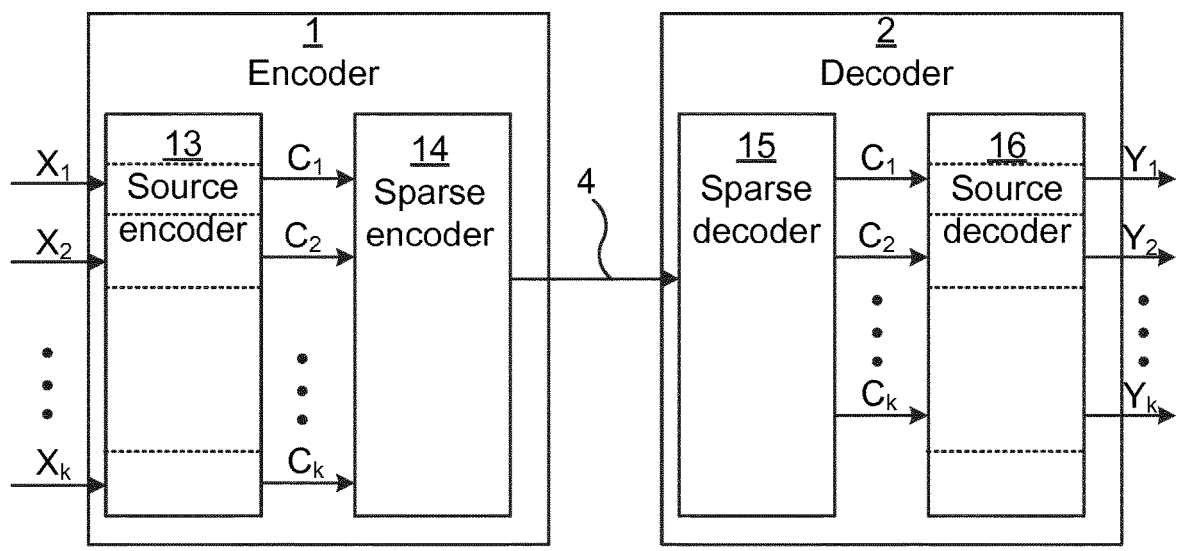
FIG. 2 is a schematic diagram illustrating details of the encoder and decoder of FIG. 1 according to one embodiment.

FIG. 2 is a schematic diagram illustrating details of the encoder and decoder of FIG. 1 according to one embodiment. There are here k channels, resulting in k samples $x_1$-$x_k$ representing haptic data. The samples $x_1$-$x_k$ are received in parallel from the different sensors connected to the encoder. The samples $x_1$-$x_k$ are here in digital form, whereby the sensor data has previously been quantized, which can occur prior to the encoder 1 or as part of the encoder 1 (not shown). The encoder 1 comprises a source encoder 13 and a sparse encoder 14. The source encoder 13 encodes, using lossy encoding, the samples $x_1$-$x_k$ into an equivalent number of codewords $c_1$-$c_k$. The sparse encoder 14 then converts the codewords $c_1$-$c_k$ in a lossless way to an encoded data stream 4 which is communicated to the decoder as explained above with reference to FIG. 1.

The decoder 2, on its side, comprises a sparse decoder 15 and a source decoder 16. The sparse decoder converts the data stream 4 to the codewords $c_1$-$c_k$, which are the same as the codewords $c_1$-$c_k$ in the encoder 1 since the sparse encoder 14 employs a lossless algorithm. It is to be noted that transmission errors between the encoder 1 and decoder 2 are not considered here and are dealt with as known in the art per se. The source decoder 16 then converts the codewords $c_1$-$c_k$ to reconstructed sample values $y_1$-$y_k$ which can be provided to actuators of the user device 8 to achieve a haptic sensation for the user.

The details of how the encoding and decoding is performed will be explained below with reference to FIGS. 3A-B (for the encoder) and FIGS. 4A-B (for the decoder).

FIGS. 3A-B are flow charts illustrating embodiments of methods for encoding haptic data for a plurality of channels. Prior to this method, the current codewords have been generated, e.g. by means of a lossy encoding which can occur in the source encoder (13 of FIG. 2).

In a determine order step 40, an order of the plurality of channels in a first list is determined based on a respective previous codeword data item for each of the plurality of channels. Each previous codeword data item is either a no-change data item indicating no change of channel data, or a change data item indicating a change of channel data. The order in the first list is such that all no-change previous codeword data items are arranged at one end of the first list. The encoder maintains an association between each previous codeword data item and its channel. The no-change codeword data items can be arranged at either end of the first list.

The no-change codeword can consist of one or more zeros. However, it is equally possible that the no-change codewords can be represented by any suitable predetermined set of one or more bits which are known to both the encoder and the decoder. In one embodiment, each previous codeword data item is the most recent previous codeword for the channel in question. In one embodiment, each previous codeword data item is derived based on a plurality of previous codewords for the channel in question. For instance, each codeword data item can be based on a sliding window of the last x number of previous codewords for the channel in question. In such an embodiment, the weights of the previous codewords forming part of the sliding window can be identical or weights gradually decrease for older previous codewords.

In an arrange current codewords step 46, current codewords are arranged in a second list accordance with the channel order of the first list. In other words, the current codewords are arranged such that their respective associated channels are in the same order as the channels of the first list.

In a group step 47, the current codewords are grouped in consecutive groups based on the order of the current codewords in the second list. Each group contains a plurality of current codewords.

In a generate group index step 48, a group index is generated. The group index indicates whether each group contains only no-change codewords or at least one change codeword. In one embodiment, the group index comprises an indicator for each group, each indicator indicating whether the respective group contains only no-change codewords or at least one change codeword indicating a change. In one embodiment, the group index consists of identifiers of those groups which contain at least one change codeword indicating a change. All other groups are then groups containing only no-change codewords. The complement is also possible; the group index then consists of identifiers of those groups which only contain no-change codewords.

In an output step 49, the group index is output along with current codewords, wherein current codewords are only output for groups containing at least one change codeword. In other words, no codewords for groups containing only no-change codewords are output. The data that is output is then transmitted to the decoder.

Looking now to FIG. 3B, only new or modified steps will be described.

The determine order step 40 here comprises a number of optional substeps 41-45.

In an optional obtain codeword data items step 41, a respective previous codeword data item is obtained for each of the plurality of channels. The previous codeword data item is ordered by channels in a first list. Each previous codeword data item is based on at least one previous codeword for the respective channel.

In an optional set first pointer step 42, a first pointer is set on the first previous codeword data item, in the first list, which is a no-change data item.

In an optional set second pointer step 43, a second pointer is set on the last previous codeword data item, in the first list, which is a change data item.

In an optional conditional first pointer before second pointer step 45, it is determined whether the first pointer is before the second pointer, in the first list. If this is the case, the method proceeds to an optional swap step 44. Otherwise, the method proceeds to the arrange current codewords step 46.

In the optional swap step 44, the previous codeword data item pointed to by the first pointer and the previous codeword data item pointed to by the second pointer are swapped. In the swapping, the encoder maintains an association between each previous codeword data item and a channel.

Figure 4A:
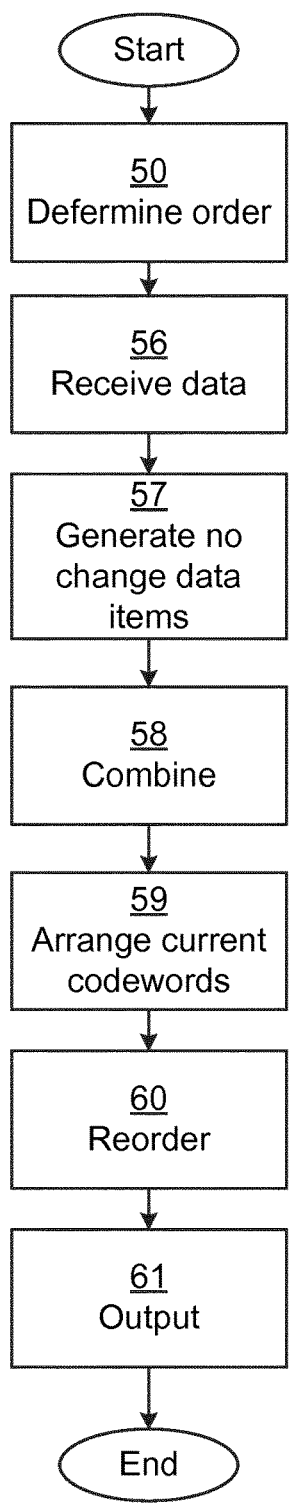
FIGS. 4A-B are flow charts illustrating embodiments of methods for decoding haptic data for a plurality of channels performed in a decoder.
Figure 4B:
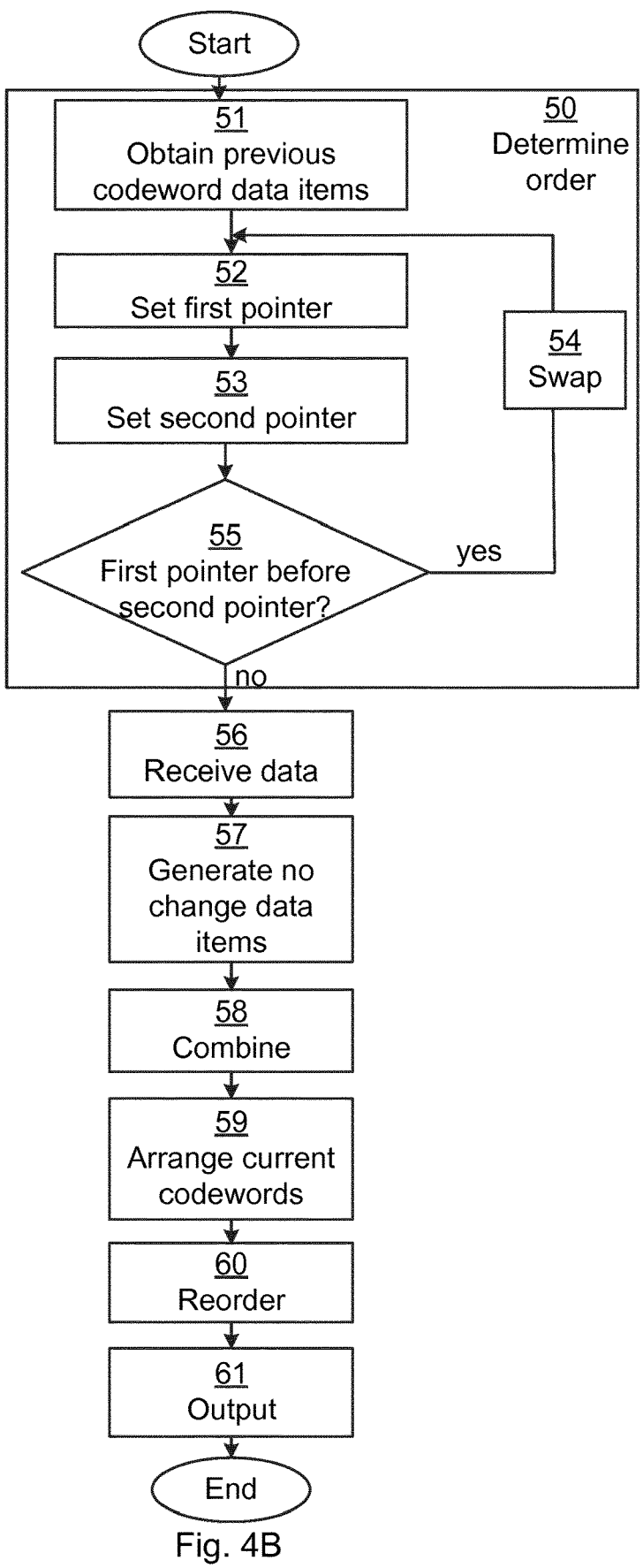

FIGS. 4A-B are flow charts illustrating embodiments of methods for decoding haptic data for a plurality of channels performed in a decoder.

In a determine order step 50, an order of the plurality of channels in a first list is determined based on a respective previous codeword data item for each of the plurality of channels. Each previous codeword data item is either a no-change data item indicating no change of channel data, or a change data item indicating a change of channel data. The order of the first list is such that all no-change previous codeword data items are arranged at one end of the first list. In one embodiment, a no-change codeword indicates a difference between samples which is lower than a perceptual threshold. For instance, the no-change codeword can consist of one or more zeros. In one embodiment, each previous codeword data item can is the most recent previous codeword for the channel in question. In one embodiment, each previous codeword data item is derived based on a plurality of previous codewords for the channel in question.

In a receive data step 56, a group index and current codewords for groups of channels of the plurality of channels are received. In one embodiment, the group index comprises an indicator for each group, each indicator indicating whether the respective group contains only no-change codewords or at least one change codeword indicating a change. In one embodiment, the group index consists of identifiers of those groups which contain at least one change codeword indicating a change. All other groups are then groups containing only no-change codewords. The complement is also possible; the group index then consists of identifiers of those groups which only contain no-change codewords.

In a generate no change data items step 57, no-change codewords are generated for channels in any group of channels indicated by the group index to contain only no-change codewords.

In a combine step 58, the generated codewords are combined with the received codewords, yielding current codewords.

In an arrange current codewords step 59, the current codewords are arranged in a second list accordance with the channel order of the first list.

In a reorder step 60, the second list is reordered by channels.

In an output step 61, the reordered second list is output.

Looking now to FIG. 4B, only new or modified steps will be described.

The determine order step 50 here comprises a number of optional substeps 51-55, corresponding to steps 41-45 of FIG. 3B.

In an optional obtain codeword data items step 51, a respective previous codeword data item is obtained for each of the plurality of channels. The previous codeword data item is ordered by channels in a first list. Each previous codeword data item is based on at least one previous codeword for the respective channel.

In an optional set first pointer step 52, a first pointer is set on the first previous codeword data item, in the first list, which is a no-change data item.

In an optional set second pointer step 53, a second pointer is set on the last previous codeword data item, in the first list, which is a change data item.

In an optional conditional first pointer before second pointer step 55, it is determined whether the first pointer is before the second pointer in the first list. If this is the case, the method proceeds to an optional swap step 54. Otherwise, the method proceeds to the receive data step 56.

In the optional swap step 54, the previous codeword data item pointed to by the first pointer and the previous codeword data item pointed to by the second pointer are swapped. In the swapping, the decoder maintains an association between each previous codeword data item and a channel.

Using the methods of FIGS. 3A-B and FIGS. 4A-B, the encoding and decoding can occur without introducing any significant delay, which would be the case e.g. if block processing is utilised.

The presented embodiment reduces the size of the bitstream by more efficient bit packetization. The embodiments can operate directly on input haptic data, or on the output of a source coding (lossy compression) scheme, which would then operate as a pre-processor to the presented scheme.

The re-ordering of channels in these embodiments is built on the observation from statistics that haptic data (sampled at 1 kHz) do not vary rapidly, and therefore optimal re-shuffling derived from the last encoded sample vector could be applied to the current input.

The compression system is mostly efficient when a significant number of sensors are inactive or the amplitude change from sample to sample is below the perceptual threshold. This is a typical situation in haptic devices.

An embodiment of encoding and decoding, employed by the methods of FIGS. 3A-B and FIGS. 4A-B, will now be described using a few examples.

In these examples, the codewords discussed below only assumes the values 1 or 0. In reality, the codewords could be the output of n-bit quantizer, where in such case, we assume that 1 is assigned to all codewords that contain at least one non-zero bit, while 0 is assigned to codewords that contain all-zero bits. As an example in 2-bit quantization, $\{00\} \rightarrow 0$, while $\{01, 10, 11\} \rightarrow 1$.

Now a first example will be described where the reordering does not occur. This will later be compared with a second example where reordering does occur, thereby illustrating the benefits of the reordering.

In the first example, at a time instance t, the sparse encoder (14 of FIG. 2) of the encoder receives a set of k codewords, $c_1, \ldots, c_k$, which correspond to quantization levels of k channels, and groups them into k/N groups with N codewords in each group. For each group, an indicator is calculated, which indicates whether the group has any change codewords. These indicators together form the group index which is sent to the decoder, together with the codewords for groups that have at least one change codeword.

In this example, the current codewords provided to the encoder comprises k=12 codewords and each group contains N=3 channels, shown in (1)

$$\{010,010,000,001\} \quad (1)$$

where commas define group boundaries. According to the description above the sparse encoder will generate a bitstream shown in (2)

$$\{1101,010,010,001\} \quad (2)$$

where the first four bits, in bold, is the group index (one indicator per group). The third group in the input bitstream (1) contains only zeros, indicating no change, and is therefore omitted from the output of the encoder. This will be detected by the decoder and the decoder can reconstruct the original bitstream by generating no-change codewords where the group index indicates a complete no-change group, in this case for the third group only.

However, as illustrated here, the input bitstream (1) consists of twelve bits, while the output bitstream (2) consists of thirteen bits. In other words, instead of compression, the encoder actually increases the number of bits required by encoding the data.

This leads to the second example, in accordance with embodiments herein, where reordering is performed to overcome this problem. In this way, a more efficient grouping of codewords is achieved, which leads to more efficient compression, since more groups contain only no-change codewords.

In the second example, we assume that the codewords in (1) is the most recent previous set of codewords. Here, for each channel, the previous codeword data item is the most recent previous codeword. As shown below, the most recent previous set of codewords is used in step 40 to determine the order of channels. In this example, the algorithm of FIG. 3B is employed.

In step 41, the previous codeword data items are obtained, in this case the codewords in (1).

In step 42, the first pointer P1 is set on the first previous codeword, in the first list, which is a no-change data item. In this example, P1 is set on channel 1.

In step 43, a second pointer P2 is set on the last previous codeword data item, in the first list, which is a change data item. In this example, P2 is set on channel 12.

At this point, the state in the encoder is reflected in Table 1.

TABLE 1

| Original encoder state | | |
|---|---|---|
| Ch | Prv cw | P:s |
| 1 | 0 | <-P1 |
| 2 | 1 | |
| 3 | 0 | |
| 4 | 0 | |
| 5 | 1 | |
| 6 | 0 | |
| 7 | 0 | |
| 8 | 0 | |
| 9 | 0 | |
| 10 | 0 | |
| 11 | 0 | |
| 12 | 1 | <-P2 |

Ch denoted the channel number, Prv cw denotes the previous codeword and P:s show the pointers.

Since P1 is before P2 (step 45), a swap (step 44) is performed. Hence, channel 1 and channel 12 are swapped (including the Prv cw). Setting the pointers again (steps 42 and 43) results in an encoder state according to Table 2.

TABLE 2

| Encoder state after one iteration | | |
|---|---|---|
| Ch | Prv cw | P:s |
| 12 | 1 | |
| 2 | 1 | |
| 3 | 0 | <-P1 |
| 4 | 0 | |
| 5 | 1 | <-P2 |
| 6 | 0 | |
| 7 | 0 | |
| 8 | 0 | |
| 9 | 0 | |
| 10 | 0 | |
| 11 | 0 | |
| 1 | 0 | |

Since P1 is still before P2 (step 45), a swap (step 44) is performed again. Hence, channel 3 and channel 5 are swapped (including the Prv cw). Setting the pointers again (steps 42 and 43) results in an encoder state according to Table 3.

TABLE 3

Encoder state after two iterations

| Ch | Prv cw | P:s |
|---|---|---|
| 12 | 1 | |
| 2 | 1 | |
| 5 | 1 | <-P2 |
| 4 | 0 | <-P1 |
| 3 | 0 | |
| 6 | 0 | |
| 7 | 0 | |
| 8 | 0 | |
| 9 | 0 | |
| 10 | 0 | |
| 11 | 0 | |
| 1 | 0 | |

Since P1 is now after P2 (step 45), the current codewords can be added. In this example, the current codewords are represented by the following set of codewords:

$$\{010,010,001,001\} \quad (3)$$

The current codewords are almost the same as the previous codeword; only channel 9 has changed from a '0' to a '1'. The current codewords are thus added (step 46) at the correct lines (based on channel number). Moreover, the grouping (step 47) is done, which then results in an encoder state as shown in Table 4:

TABLE 4

Encoder state with current codewords and grouping

| Ch | Curr. Cw | Prv cw | Group |
|---|---|---|---|
| 12 | 1 | 1 | I |
| 2 | 1 | 1 | I |
| 5 | 1 | 1 | I |
| 4 | 0 | 0 | II |
| 3 | 0 | 0 | II |
| 6 | 0 | 0 | II |
| 7 | 0 | 0 | III |
| 8 | 0 | 0 | III |
| 9 | 1 | 0 | III |
| 10 | 0 | 0 | IV |
| 11 | 0 | 0 | IV |
| 1 | 0 | 0 | IV | where Curr. cw denotes the current codeword. Hence, resulting set of data in the groups is represented by (4), i.e. the current codewords in the order of Table 4:

$$\{111,000,001,000\} \quad (4)$$

Note that the current codeword differs from the previous codeword for channel 9.

In step 48, the group index is generated, which becomes {1010}. The resulting encoded data which is output (step 49) is then shown in (5):

$$\{1010,111,001\} \quad (5)$$

Hence, there is a data reduction from twelve bits in (3) to ten bits in (5). Note that if there had been no data change in channel 9, the encoding would have been even more efficient since then the codewords of group III could also have been omitted.

In the decoder, steps 51-55 correspond to steps 41-45. Since the decoder also works on the same previous data items as the encoder, the decoder also works out Table 3.

Once the reordering is determined, the data (5) is received from the encoder (step 56). The no-change codewords are then generated in step 57, and combined in step 58 with the received data, resulting in the data of (4). Note that the steps 56, 57 and 58 could also be performed prior to, or in parallel with, the reordering of steps 51-55.

The combined codewords are arranged in step 59 in accordance with the reordered channels (based on Table 3). Hence, the decoder is then in a state according to Table 5:

TABLE 5

Decoder state based on reordering

| Ch | Curr. cw |
|---|---|
| 12 | 1 |
| 2 | 1 |
| 5 | 1 |
| 4 | 0 |
| 3 | 0 |
| 6 | 0 |
| 7 | 0 |
| 8 | 0 |
| 9 | 1 |
| 10 | 0 |
| 11 | 0 |
| 1 | 0 |

This table is then sorted according to channel number in the reorder step 60. This results in the decoder state according to Table 6.

TABLE 6

End state at the decoder

| Ch | Curr. cw |
|---|---|
| 1 | 0 |
| 2 | 1 |
| 3 | 0 |
| 4 | 0 |
| 5 | 1 |
| 6 | 0 |
| 7 | 0 |
| 8 | 0 |
| 9 | 1 |
| 10 | 0 |
| 11 | 0 |
| 12 | 1 |

The current codewords of Table 6 can be expressed in a more condensed form as (6), which is identical to (3), whereby the decoding is completed.

$$\{010,010,001,001\} \quad (6)$$

Since the reordering is the same in both the encoder and the decoder, and is based on the same (previous codeword data), the reordering does not need to be explicitly provided from the encoder to the decoder. This allows the encoder to compress signals efficiently while still allowing the decoder to restore the data without any loss.

Figure 5:
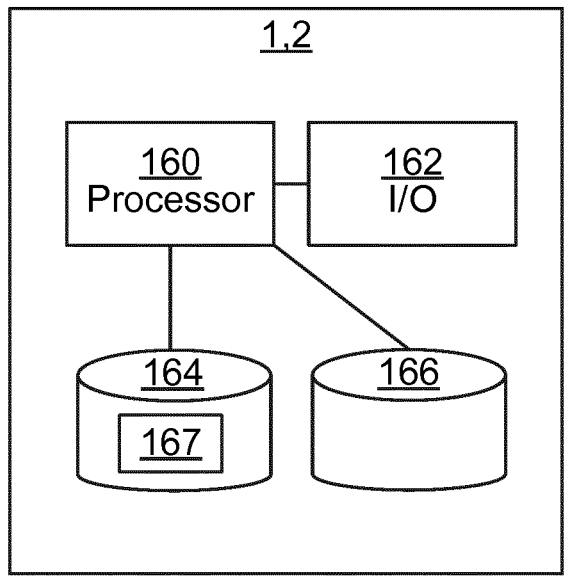
FIG. 5 is a schematic diagram illustrating components of the encoder and decoder of FIG. 1, according to one embodiment.

FIG. 5 is a schematic diagram illustrating components of the encoder 1 and decoder 2 of FIG. 1, according to one embodiment. Each of the encoder 1 and the decoder 2 comprises the components described here. A processor 60 is provided using any combination of one or more of a suitable central processing unit (CPU), multiprocessor, microcontroller, digital signal processor (DSP), application specific integrated circuit etc., capable of executing software instructions 67 stored in a memory 64, which can thus be a computer program product. The processor 60 can be configured to execute the method described with reference to FIGS. 3 and 4 above for the encoder 1 and the decoder 2, respectively.

The memory 64 can be any combination of read and write memory (RAM) and read only memory (ROM). The memory 64 also comprises persistent storage, which, for example, can be any single one or combination of magnetic memory, optical memory, solid state memory or even remotely mounted memory.

A data memory 66 is also provided for reading and/or storing data during execution of software instructions in the processor 6o, e.g. the current codewords and previous codeword data. The data memory 66 can be any combination of read and write memory (RAM) and read only memory (ROM).

The encoder 1/decoder 2 further comprises an I/O interface 62 for communicating with other external entities. Optionally, the I/O interface 62 also includes a user interface.

Figure 6:
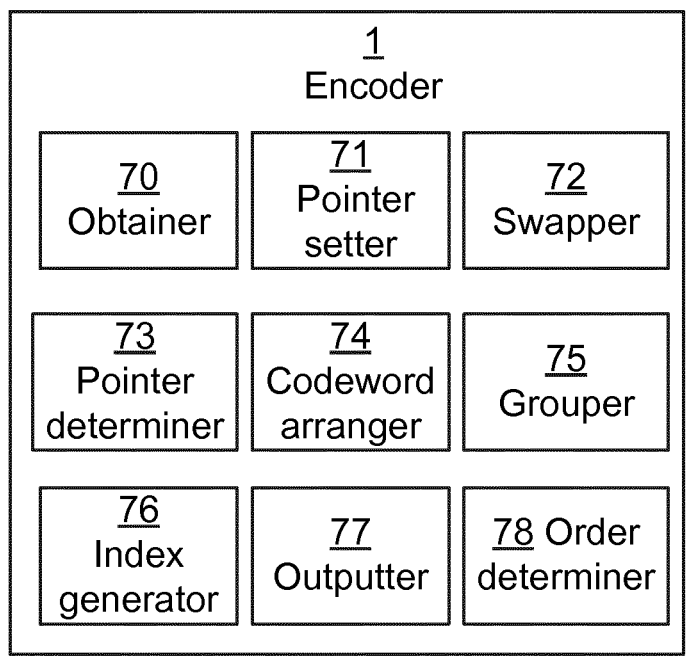
FIG. 6 is a schematic diagram showing functional modules of the encoder of FIG. 1 according to one embodiment.

FIG. 6 is a schematic diagram showing functional modules of the encoder 1 of FIG. 1 according to one embodiment. The modules are implemented using software instructions such as a computer program executing in the encoder 1. Alternatively or additionally, the modules are implemented using hardware, such as any one or more of an ASIC (Application Specific Integrated Circuit), an FPGA (Field Programmable Gate Array), or discrete logical circuits. The modules correspond to the steps in the methods illustrated in FIGS. 3A-B.

An obtainer 70 corresponds to step 41. A pointer setter 71 corresponds to steps 42 and 43. A swapper 72 corresponds to step 44. A pointer determiner 73 corresponds to step 45. A codeword arranger 74 corresponds to step 46. A grouper 75 corresponds to step 47. An index generator 76 corresponds to step 48. An outputter 77 corresponds to step 49. An order determiner 78 corresponds to step 40.

Figure 7:
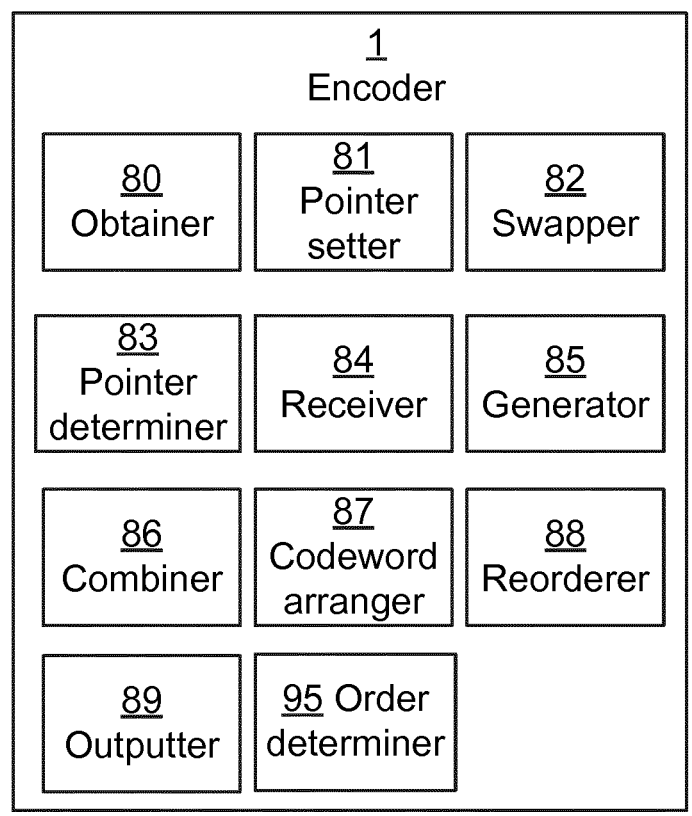
FIG. 7 is a schematic diagram showing functional modules of the decoder of FIG. 1 according to one embodiment.

FIG. 7 is a schematic diagram showing functional modules of the decoder 2 of FIG. 1 according to one embodiment. The modules are implemented using software instructions such as a computer program executing in the decoder 2. Alternatively or additionally, the modules are implemented using hardware, such as any one or more of an ASIC (Application Specific Integrated Circuit), an FPGA (Field Programmable Gate Array), or discrete logical circuits. The modules correspond to the steps in the methods illustrated in FIGS. 4A-B.

An obtainer 80 corresponds to step 51. A pointer setter 81 corresponds to steps 52 and 53. A swapper 82 corresponds to step 54. A pointer determiner 83 corresponds to step 55. A receiver 84 corresponds to step 56. A generator 85 corresponds to step 57. A combiner 86 corresponds to step 58. A codeword arranger 87 corresponds to step 59. A reorderer 88 corresponds to step 6o. An outputter 89 corresponds to step 61. An order determiner 95 corresponds to step 50.

Figure 8:
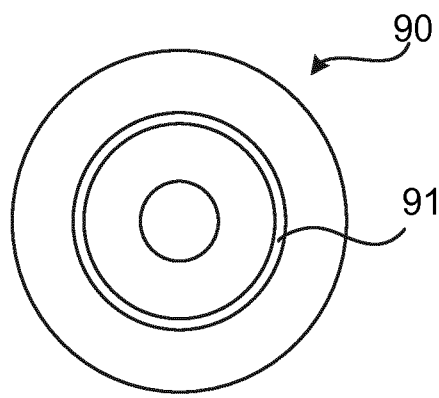
FIG. 8 shows one example of a computer program product comprising computer readable means.

FIG. 8 shows one example of a computer program product comprising computer readable means. On this computer readable means a computer program 91 can be stored, which computer program can cause a processor to execute a method according to embodiments described herein. In this example, the computer program product is an optical disc, such as a CD (compact disc) or a DVD (digital versatile disc) or a Blu-Ray disc. As explained above, the computer program product could also be embodied in a memory of a device, such as the computer program product 164 of FIG. 5. While the computer program 91 is here schematically shown as a track on the depicted optical disk, the computer program can be stored in any way which is suitable for the computer program product, such as a removable solid state memory, e.g. a Universal Serial Bus (USB) drive.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A method for encoding haptic data for a plurality of channels, the method being performed by an encoder and comprising the steps of:

determining an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list;

arranging current codewords in a second list accordance with the channel order of the first list;

grouping the current codewords in consecutive groups based on the order of the current codewords in the second list; wherein each group contains a plurality of current codewords;

generating a group index indicating whether each group contains only no-change codewords or at least one change codeword; and outputting the group index along with current codewords, wherein current codewords are only output for groups containing at least one change codeword.

2. The method of claim 1, wherein the step of determining an order comprises the sub-steps of:

obtaining a respective previous codeword data item for each of the plurality of channels, the previous codeword data item being ordered by channels in a first list, each previous codeword data item being based on at least one previous codeword for the respective channel;

setting a first pointer on the first previous codeword data item, in the first list, which is a no-change data item;

setting a second pointer on the last previous codeword data item, in the first list, which is a change data item;

swapping the previous codeword data item pointed to by the first pointer and the previous codeword data item pointed to by the second pointer, when the first pointer is before the second pointer in the first list, wherein each previous codeword data item keeps a channel reference during the swapping; and repeating the steps of setting a first pointer, setting a second pointer and swapping until the first pointer is after the second pointer in the first list.

3. The method of claim 1, wherein the no-change codeword consists of one or more zeros.

4. The method of claim 1, wherein the group index comprises an indicator for each group, each indicator indicating whether the respective group contains only no-change data items or at least one change data item.

5. An encoder for encoding haptic data for a plurality of channels, the encoder comprising:

a processor; and a memory storing instructions that, when executed by the processor, causes the encoder to:

determine an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list;

arrange current codewords in a second list accordance with the channel order of the first list;

group the current codewords in consecutive groups based on the order of the current codewords in the second list; wherein each group contains a plurality of current codewords;

generate a group index indicating whether each group contains only no-change codewords or at least one change codeword; and output the group index along with current codewords, wherein current codewords are only output for groups containing at least one change codeword encoder.

6. The encoder of claim 5, wherein the instructions to determine an order comprise instructions to:

obtain a respective previous codeword data item for each of the plurality of channels, the previous codeword data item being ordered by channels in a first list, each previous codeword data item being based on at least one previous codeword for the respective channel;

set a first pointer on the first previous codeword data item, in the first list, which is a no-change data item;

set a second pointer on the last previous codeword data item, in the first list, which is a change data item;

swap the previous codeword data item pointed to by the first pointer and the previous codeword data item pointed to by the second pointer, when the first pointer is before the second pointer in the first list, wherein each previous codeword data item keeps a channel reference during the swapping; and repeat the instructions to set a first pointer, set a second pointer and swap until the first pointer is after the second pointer in the first list.

7. The encoder of claim 5, wherein the no-change codeword consists of one or more zeros.

8. The encoder of claim 5, wherein the group index comprises an indicator for each group, each indicator indicating whether the respective group contains only no-change data items or at least one change data item.

9. The encoder of claim 5, wherein each previous codeword data item is the most recent previous codeword for the channel in question.

10. The encoder of claim 5, wherein each previous codeword data item is derived based on a plurality of previous codewords for the channel in question.

11. A method for decoding haptic data for a plurality of channels, the method being performed by a decoder and comprising the steps of:

determining an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list;

receiving a group index and current codewords for groups of channels of the plurality of channels;

generating no-change codewords for channels in any group of channels indicated by the group index to contain only no-change codewords;

combining the generated codewords with the received codewords, yielding current codewords;

arranging the current codewords in a second list accordance with the channel order of the first list;

reordering the second list by channels; and outputting the reordered second list.

12. The method of claim 11, wherein the step of determining an order comprises the sub-steps of:

obtaining a respective previous codeword data item for each of the plurality of channels, the previous codeword data items being ordered by channels in a first list, each previous codeword data item being based on at least one previous codeword for the respective channel;

setting a first pointer on the first previous codeword data item, in the first list, which is a no-change data item;

setting a second pointer on the last previous codeword data item, in the first list, which is a change data item;

swapping the previous codeword data item pointed to by the first pointer and the previous codeword data item pointed to by the second pointer, when the first pointer is before the second pointer in the first list, wherein each previous codeword data item keeps a channel reference during the swapping; and repeating the steps of setting a first pointer, setting a second pointer and swapping until the first pointer is after the second pointer in the first list.

13. The method of claim 11, wherein the no-change codeword consists of one or more zeros.

14. The method of claim 11, wherein the group index comprises an indicator for each group, each indicator indicating whether the respective group contains only no-change data items or at least one change data item.

15. A decoder for decoding haptic data for a plurality of channels, the decoder comprising:

a processor; and a memory storing instructions that, when executed by the processor, causes the decoder to:

determine an order of the plurality of channels in a first list based on a respective previous codeword data item for each of the plurality of channels, each previous codeword data item being either a no-change data item indicating no change of channel data, or a change data item indicating a change of channel data, wherein the order is such that all no-change previous codeword data items are arranged at one end of the first list;

receive a group index and current codewords for groups of channels of the plurality of channels;

generate no-change codewords for channels in any group of channels indicated by the group index to contain only no-change codewords;

combine the generated codewords with the received codewords, yielding current codewords;

arrange the current codewords in a second list accordance with the channel order of the first list;

reorder the second list by channels; and output the reordered second list.

16. The decoder of claim 15, wherein the instructions to determine an order comprise instructions to:

obtain a respective previous codeword data item for each of the plurality of channels, the previous codeword data items being ordered by channels in a first list, each previous codeword data item being based on at least one previous codeword for the respective channel;

set a first pointer on the first previous codeword data item, in the first list, which is a no-change data item;

set a second pointer on the last previous codeword data item, in the first list, which is a change data item;

swap the previous codeword data item pointed to by the first pointer and the previous codeword data item pointed to by the second pointer, when the first pointer is before the second pointer in the first list, wherein each previous codeword data item keeps a channel reference during the swapping; and repeat the instructions to set a first pointer, set a second pointer and swap until the first pointer is after the second pointer in the first list.

17. The decoder of claim 15, wherein the no-change codeword consists of one or more zeros.

18. The decoder of claim 15, wherein the group index comprises an indicator for each group, each indicator indicating whether the respective group contains only no-change data items or at least one change data item.

19. The decoder of claim 15, wherein each previous codeword data item is the most recent previous codeword for the channel in question.

20. The decoder of claim 15, wherein each previous codeword data item is derived based on a plurality of previous codewords for the channel in question.

\* \* \* \* \*